United States Patent
Kapetanic et al.

(10) Patent No.: US 6,714,898 B1
(45) Date of Patent: *Mar. 30, 2004

(54) FLEXIBLE NOISE FIGURE MEASUREMENT APPARATUS

(75) Inventors: Peter Kapetanic, Morgan Hill, CA (US); Jon Martens, San Jose, CA (US); David Rangel, San Jose, CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/388,016

(22) Filed: Sep. 1, 1999

Related U.S. Application Data

(60) Provisional application No. 60/098,862, filed on Sep. 2, 1998, and provisional application No. 60/098,865, filed on Sep. 2, 1998.

(51) Int. Cl.⁷ .......................... H04B 15/00; G06F 15/00
(52) U.S. Cl. ........................ 702/191; 324/638
(58) Field of Search ............... 702/60, 66–67, 702/69–71, 73–76, 85, 106–107, 109, 111, 117, 120–121, 124–126, 181, 183, 185, 189, 191; 324/638, 601, 613

(56) References Cited

U.S. PATENT DOCUMENTS

| | | | | |
|---|---|---|---|---|
| 4,998,071 A | * | 3/1991 | Strid et al. | 324/613 |
| 5,170,126 A | * | 12/1992 | Wedge et al. | 324/613 |
| 5,172,064 A | * | 12/1992 | Walls | 324/601 |
| 5,191,294 A | * | 3/1993 | Grace et al. | 324/613 |
| 5,327,091 A | * | 7/1994 | Loughry | 324/627 |
| 5,416,422 A | * | 5/1995 | Dildine | 324/614 |
| 5,596,600 A | * | 1/1997 | Dimos et al. | 375/148 |
| 5,608,331 A | * | 3/1997 | Newberg et al. | 324/613 |
| 5,668,837 A | * | 9/1997 | Dent | 375/316 |
| 5,745,856 A | * | 4/1998 | Dent | 455/552.1 |
| 5,859,878 A | * | 1/1999 | Phillips et al. | 375/316 |
| 6,020,733 A | * | 2/2000 | Bradley | 324/76.23 |
| 6,066,953 A | * | 5/2000 | Wadell | 324/601 |
| 6,184,693 B1 | * | 2/2001 | Arai et al. | 324/613 |
| 6,529,844 B1 | * | 3/2003 | Kapetanic et al. | 702/85 |

OTHER PUBLICATIONS

Nimmagadda et al., "Measurement, Modeling and Simulation of a High Speed Digital System Using VNA and HSPICE", Nov. 1996, Northcon, pp. 158–161.*

Davidson et al., "Accuracy Improvements in Microwave Noise Parameter Measurements", Dec. 1989, Microwave Theory and Techniques, vol. 37 No. 12, pp. 1973–1978.*

Wiatr et al., "Simultaneous Noise and Vector Network Analysis Using Radiometer Systems", May 20–22, 1998, Microwave and Radar, vol. 4, pp. 198–229.*

* cited by examiner

Primary Examiner—Marc S. Hoff
Assistant Examiner—Mary Catherine Baran
(74) Attorney, Agent, or Firm—Fleisler Meyer LLP

(57) ABSTRACT

An instrument is provided for measuring a noise figure with significant flexibility. The instrument includes a noise source (306) and a vector network analyzer (VNA) (300). The VNA (300) includes an external connector port (302) for removable connection of the noise source (306). The noise source (306) can be connected to the VNA backplane port (302), or directly to a DUT (350). The DUT (350) can be connected to both VNA test ports (310,314) if the noise source (306) is connected to port (302), or only to test port (314) if the noise source (306) is directly connected to the DUT. A receiver connected to the test port (314) includes a downconverter (324) providing an IF signal through either a narrowband IF channel (350) or a wideband IF channel (352) for providing both wideband and narrowband power measurements enabling fast accurate measurement of a noise figure.

4 Claims, 2 Drawing Sheets

FLEXIBLE NOISE FIGURE MEASUREMENT APPARATUS

CROSS-REFERENCE TO PROVISIONAL APPLICATION

This Patent Application claims the benefit of Provisional Application No. 60/098,862, filed Sep. 2, 1998 and Provisional Application No. 60/098,865, filed Sep. 2, 1998.

BACKGROUND OF THE INVENTION

1. Field of the Invention

The present invention relates to a noise source and vector network analyzer (VNA) used for noise figure measurement.

2. Description of the Related Art

A variety of configurations of test equipment are available for measuring noise parameters of a device under test (DUT). The accuracy of noise measurements is particularly important for components intended to operate at RF/microwave frequencies, since lower-frequency components usually can meet noise specifications.

The noise parameters of a component are usually specified in terms of noise factor F. The noise factor of a device is defined as the ratio of the signal-to-noise ratio available from the device output to the signal-to-noise ratio delivered to the input of the device, at a standard reference temperature of 290K. Noise factor is often expressed in dB, at which time it is sometimes referred to as a noise figure (NF).

Conventional components used for measuring NF include a noise source, a receiver, and an S-parameter measuring apparatus such as a VNA. The noise source and receiver can be manufactured as components separate from the VNA as illustrated in FIG. 1, or the noise source and receiver can be included permanently within the VNA, as illustrated in FIG. 2.

FIG. 1 shows the noise source and receiver provided separate from the VNA for connection to measure the noise figure of a DUT. The VNA is connected separately to the components for calibration when desired. The noise source typically includes a noise diode connected to a power supply. The noise source provides noise over a wide bandwidth to one port of a DUT, while the other port is connected to a receiver. The receiver downconverts the noise source signal from the DUT to an intermediate frequency (IF) range, and the IF signal is processed to provide an indication of power level enabling the noise figure to be determined over the frequency range.

The noise source and receiver shown in FIG. 1 can be provided together in a single noise module for measuring noise figure. Such a noise module is disclosed in U.S. Pat. No. 5,191,294. The noise module described in U.S. Pat. No. 5,191,294 includes ports for connection of both a DUT and a VNA enabling use of the VNA to calibrate components for improved noise figure measurements without errors potentially resulting when a VNA is connected and disconnected during measurements.

Components for measurement of noise figure can also be included internally to some VNAs, as shown in FIG. 2. As shown, the noise source in the VNA is connectable by a switch A through a reflectometer A to the measurement port A of the VNA. The switch A normally connects the signal source of the VNA through the reflectometer A to the test port A for standard VNA measurements and is switched to the noise source when noise figure measurements are desired. Similarly, a receiver B is connectable by a switch B to the test port B of the VNA. The switch B then normally connects to the signal source for standard VNA measurements and is switched to the receiver when noise figure measurements are desired. The receiver is normally included in the VNA for downconverting and processing signals received from reflectometers A and B, and is further configured to downconvert and process the signal from the noise source as provided through the DUT when the switches A and B are connected for noise figure measurements.

While noise figure measurements have been performed for years with a wide variety of instruments, the instruments have lacked flexibility. Usually the noise source must be attached directly to the DUT for all measurements, or the noise source is provided internally in an instrument for all measurements. The user, thus, has little choice with respect to test setup or traceability, or the ability to easily change to using a noise source with a more appropriate ENR (excess noise ratio) for the DUT.

Devices for measuring noise figure also do not allow a selection of frequency bandwidths for measurements which may limit the types of DUTs that can be measured using one test device. The measurement bandwidth being fixed for a given test system may also lead to either inordinately long test times or to inaccurate results.

SUMMARY OF THE INVENTION

In accordance with the present invention, a configuration of test equipment is provided to allow user selection of different types of noise sources with different ENRs which can be connected either directly to a DUT, or through a VNA to the DUT to make noise figure measurements more flexible. The test equipment also includes a receiver with two IF signal processing paths to generate wide and narrow bandwidth power measurements to provide further flexibility.

Direct connection of the noise source to the DUT leads to the simplest measurement of noise figure and maintains tracability. Alternatively the noise source may be connected to the rear panel of the VNA with the noise source signal routed through a switch and other hardware to a first VNA test port where a DUT terminal is connected for testing. This approach, while one level less traceable than a direct connection of the noise source to the DUT, may lead to more convenient measurements since the DUT may remain connected to the ports for other measurements. The indirect connection approach may also add to more accurate results since, assuming the VNA has characterized the signal path, the VNA can make corrections to account for DUT mismatches, and to provide more accurate gain measurements.

The output of the DUT feeds a second VNA test port where the signal will pass through switches to a receiver for indicating power level. The receiver includes a downconverter which generates an IF signal which is provided to one of two paths for wideband and narrowband power measurements. The wideband IF path is provided for fastest measurements, but may be inappropriate for some narrowband DUTS. While numerical correction is available for moderately narrowband DUTs, this does not cover all scenarios. For this reason a narrowband IF path is made available for measuring the noise figure of very narrowband devices such as devices operating over less than a 1 MHz bandwidth.

Thus, in accordance with the present invention a dual IF scheme and a switchable noise source are incorporated together to:

(a) Enhance measurement flexibility by allowing a user to choose between the importance of traceability vs. fixturing simplicity and/or potential accuracy enhancements by selecting a noise source position;

(b) Allow a choice of measurement bandwidths enabling a wider range of DUTs to be measured;

(c) Enable access to the signal path so a user can recharacterize the path and improve measurement accuracy using a VNA;

(d) Enhance measurement flexibility by allowing a user to easily change the noise source to one that is more appropriate for the testing of a given DUT; and (e) Keep the noise source external to the measurement system so that the noise source is not subject to the internal temperature rise within the measurement system, and the measurements maintain a higher level of accuracy.

BRIEF DESCRIPTION OF THE DRAWINGS

Further details of the present invention are explained with the help of the attached drawings in which.

DETAILED DESCRIPTION

Figure 1:
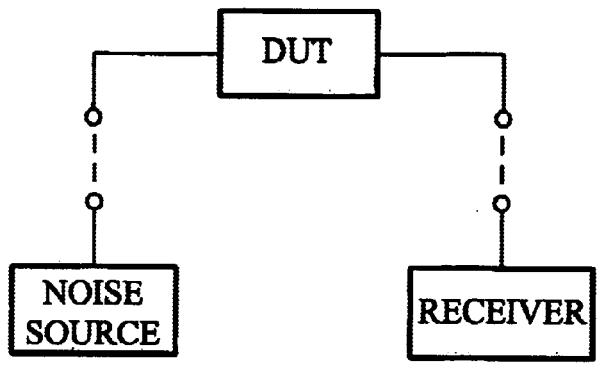
FIG. 1 shows a noise source and receiver for connection to measure the noise figure of a DUT.
Figure 2:
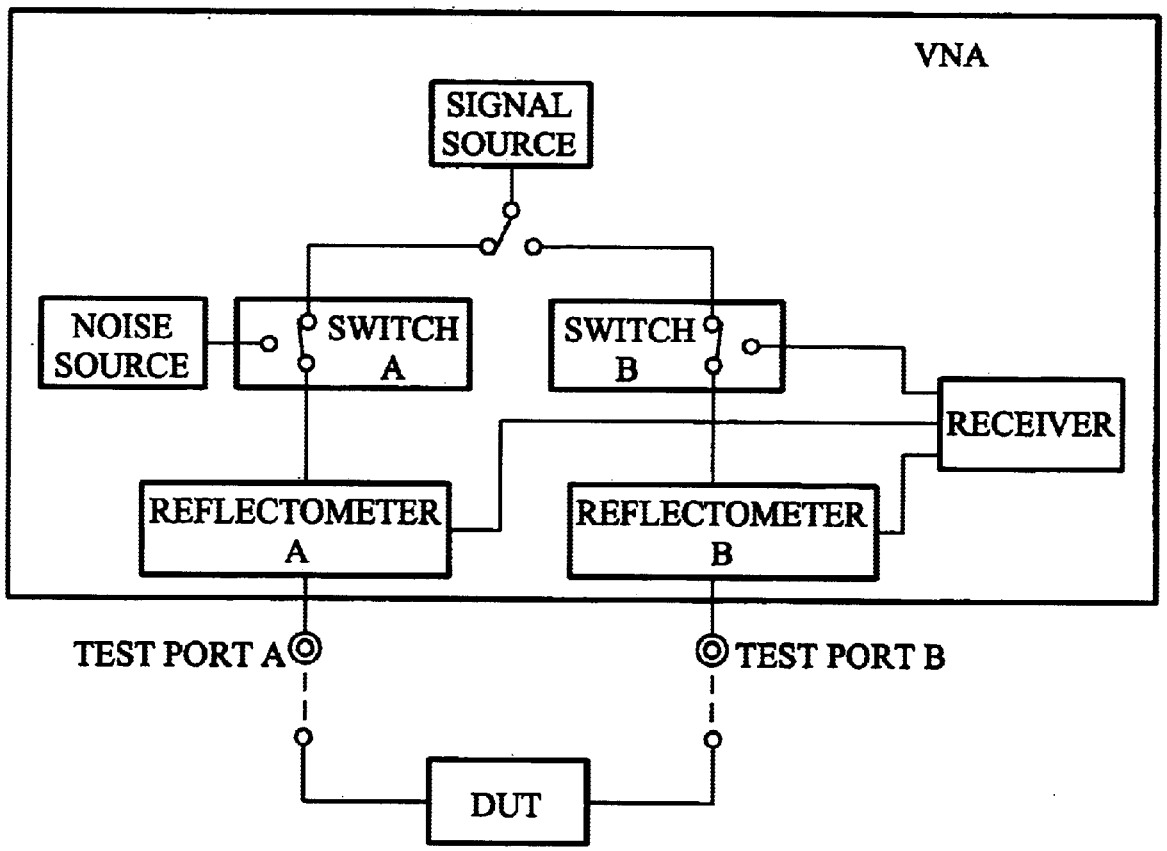
FIG. 2 shows VNA with an internally connectable noise source and receiver for noise figure measurements.
Figure 3:
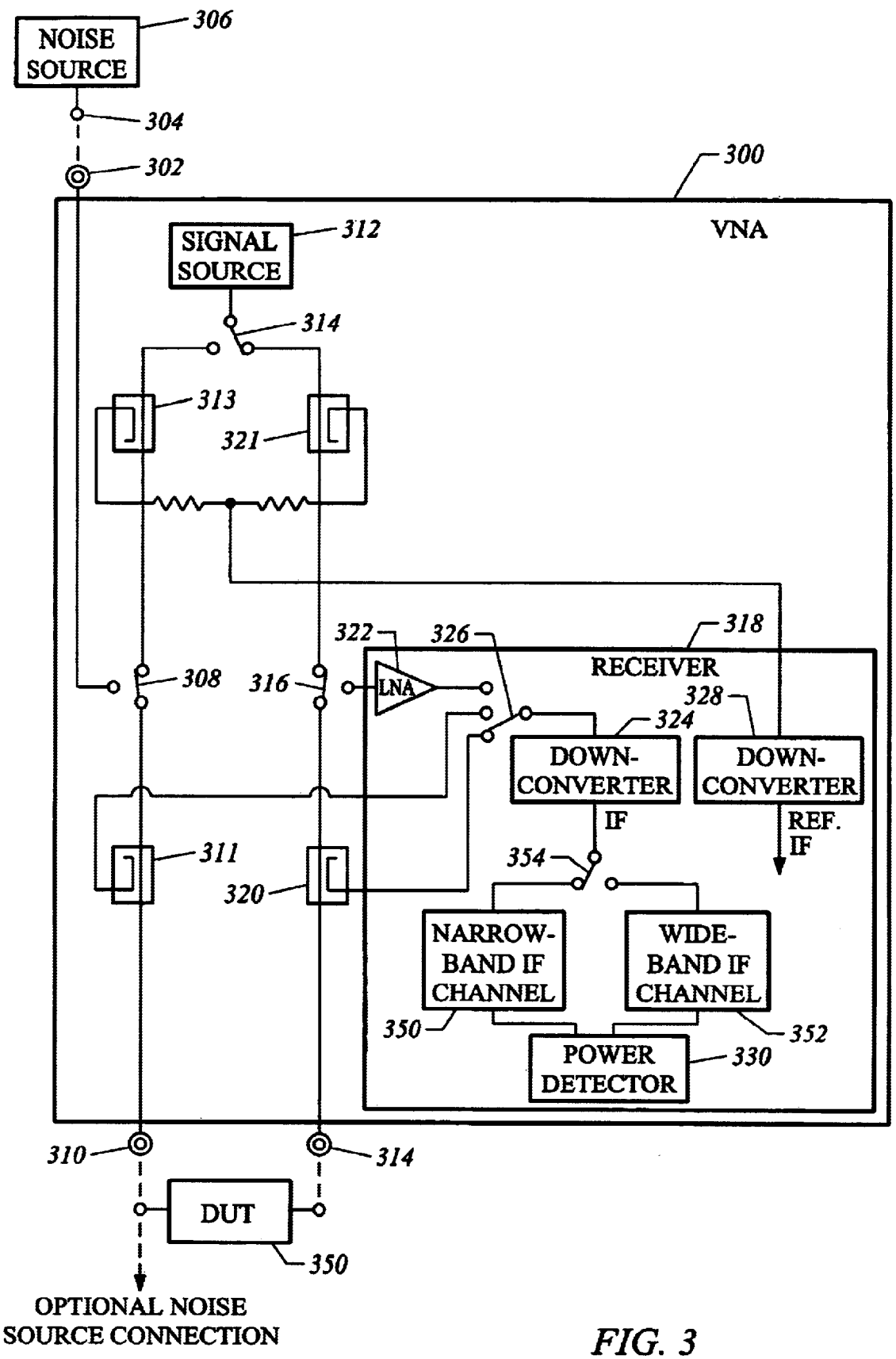
FIG. 3 shows components for making noise figure measurements in accordance with the present invention.

FIG. 3 shows components in accordance with the present invention for making more flexible noise figure measurements than previous systems. The components include a VNA 300 and a noise source 306. The noise source 306 has a connector 304 for connection to a connector on a port 302 on the backplate of the VNA 300. The port 302 and connector 304 may be disconnected as illustrated by the dashed line, and the noise source can be directly connected to a DUT 350, as illustrated by the additional dashed lines from DUT 350.

With the noise source 306 connected to port 302, the DUT can be connected between test ports 310 and 314 of the VNA 300. With the DUT connected between the test ports 310 and 314, subsequent measurements can be made of the DUT using the VNA without introducing errors due to movement of the test setup during or after noise figure measurements are made.

With the noise source 306 connected to port 302, noise figure measurements may be made by connecting switches 308 and 316 to the port 302 and to the receiver 318. The switch 308 has a common terminal connected through a VNA reflectometer coupler 311 to port 310, a primary switching terminal connected to a reflectometer coupler 313, and a secondary terminal connected to port 302. The switch 316 has a common terminal connected through a reflectometer coupler 320 to port 314, a primary switching terminal connected to a reflectometer coupler 321 of a reflectometer of the VNA, and a secondary terminal connected to a receiver 318 for noise figure measurements. The VNA signal source 312 is connectable by switch 354 to the reflectometer couplers 313 and 321 of the VNA for standard VNA measurements.

To avoid measurement errors through the path from port 302 to the test port 310, the noise source 306 can be connected directly to one terminal of the DUT 350, while the second terminal of the DUT is connected to port 314 of the VNA 300. With the DUT 350 connected directly to the noise source 306, the switch 316 is controlled to connect test port 314 to the receiver 318. The VNA includes a controller and keypad (not shown), or connection to a separate controlling computer (not shown), to allow user and/or software control of components in the VNA 300, such as switches 308 and 316, depending on whether noise figure or standard VNA measurements are desired.

The receiver 318 in accordance with the present invention can include two downconverters 324 and 328 which are normally included in a VNA. The downconverter 328 is connected to the coupling path of reflectometer couplers 313 and 321, and serves to downconvert the RF signal from the signal source 312 to a reference IF signal. The downconverter 324 is connected by a switch 326 to one of the reflectometer couplers 311 and 320, and serves to downconvert the RF signal received at one of test ports 310 or 314 to an test IF signal.

In accordance with the present invention the switch 326 includes a third connection terminal for connection to the switch 316 through a low noise amplifier (LNA) 322. The switch 326 connects to the switch 316 through the LNA 322 when noise figure measurements are desired. When noise figure measurements are made, the downconverter 324 then serves to downconvert the RF signal from the noise source 306 to an IF signal.

The test IF output of the downconverter 324 is provided through a narrowband IF channel 350 when typical VNA measurements are made, and the narrowband IF signals are processed to provide measurement results. The narrowband IF channel typically includes at least one filter for removing signals outside the narrowband IF frequency range, and components for further downconversion and processing of the IF signal. The reference IF signal from downconverter 328 is similarly provided through such a narrowband IF channel (not shown).

In accordance with the present invention, a switch 354 is further provided to provide the IF output from downconverter 354 through either the narrowband IF channel 350, or the wideband IF channel 352. The wideband IF channel 352 includes at least one filter and components for processing the IF signal, wherein the filtered and processed signal from the wideband IF channel 352 has a greater frequency range than the narrowband IF channel 350.

The wideband IF channel 352 provides operation over a frequency range typical for receivers used with noise sources for noise figure measurement. The narrowband IF channel 350 includes components operating over a narrower frequency range than the wideband IF path 352 to allow more accurate results, particularly for narrow band DUTs. The narrowband IF path in one embodiment includes components for processing signals over less than a 1 MHZ bandwidth. The switch 324 is controlled to connect the downconverter 324 to either the narrowband IF path 350 or the wideband path 352 depending on whether narrow or wideband measurement are desired.

The output of the narrowband IF channel 350 and the wideband IF channel 352 are provided to a power detector 330. The power detector 330 then provides a power indication enabling noise figure to be determined and indicated on the display (not shown) of the VNA 300. The power detector 330 can be implemented by a digital signal processor (DSP) which is typically included in a VNA for processing the IF signals from downconverters 324 and 328.

Although the present invention has been described above with particularity this was merely to teach one of ordinary skill how to make and use the invention. Many changes and modifications will be apparent to those skilled in the art within the scope of the invention as defined by the following claims.

What is claimed is:

1. A kit for measuring a noise figure for a device under test, the kit comprising:
   a noise source having a connector; and
   a vector network analyzer (VNA) comprising;
   a signal source;
   a first switch having a common terminal coupled to the signal source, a first switching terminal, and a second switching terminal;
   a first noise source connection port for connecting to the connector of the noise source;
   a first test port;
   a second switch having a common terminal coupled to the first test port, a first switching terminal coupled to the first noise source connection port, and a second switching terminal coupled to the first switching terminal of the first switch;
   a second test port;
   a third switch having a common terminal coupled to the second test port, a first switching terminal coupled to the receiver, and a second switching terminal coupled to the second switching terminal of the first switch;
   a first reflectometer coupler having a signal path connecting the first switching terminal of the first switch to the second switching terminal of the second switch; and
   a second reflectometer coupler having a signal path connecting the second switching terminal of the first switch to the second switching terminal of the third switch.

2. The kit of claim 1, wherein the VNA further comprises:
   a third reflectometer coupler having a signal path connecting the first test port to the first switching terminal of the second switch; and
   a fourth reflectometer coupler having a signal path connecting the second test port to the first switching terminal of the third switch.

3. A vector network analyzer (VNA) with noise figure measurement components comprising:
   a first noise source connection port enabling removable connection of a noise source;
   a signal source;
   a first switch having a common terminal coupled to the signal source, a first switching terminal, and a second switching terminal;
   a first test port;
   a second switch having a common terminal coupled to the first test port, a first switching terminal coupled to the first noise source connection port, and a second switching terminal coupled to the first switching terminal of the first switch;
   a receiver;
   a second test port;
   a third switch having a common terminal coupled to the second test port, a first switching terminal coupled to the receiver, and a second switching terminal coupled to the second switching terminal of the first switch;
   a first reflectometer coupler having a signal path connecting the first switching terminal of the first switch to the second switching terminal of the second switch; and
   a second reflectometer coupler having a signal path connecting the second switching terminal of the first switch to the second switching terminal of the third switch.

4. The VNA of claim 3 further comprising:
   a third reflectometer coupler having a signal path connecting the first test port to the first switching terminal of the second switch; and
   a fourth reflectometer coupler having a signal path connecting the second test port to the first switching terminal of the third switch.

* * * * *